Aug. 22, 1961 W. P. BOOTHROYD 2,997,536

POSITIONING MECHANISM

Filed Feb. 5, 1959

INVENTOR.
WILSON P. BOOTHROYD
BY
Harry W. Hargis III
AGENT

United States Patent Office 2,997,536
Patented Aug. 22, 1961

2,997,536

POSITIONING MECHANISM

Wilson P. Boothroyd, Huntingdon Valley, Pa., assignor to Philco Corporation, Philadelphia, Pa., a corporation of Pennsylvania Filed Feb. 5, 1959, Ser. No. 791,377
2 Claims. (Cl. 178—6)

This invention relates to positioning mechanisms, and more particularly to mechanisms for positioning rotatable shafts such, for example, as are commonly used to control the tuning apparatus of radio or television equipment. The invention has especial adaptability in the driving of television receiver channel selector switches.

In the television art, for example, demand for so-called "remote" tuning apparatus for receivers has become increasingly widespread. While a variety of forms of such apparatus has been made available, difficulties have been encountered in providing inexpensive, positively actuatable mechanisms characterized by simplicity of construction and ease of operation.

It is, therefore, a broad objective of the invention to provide mechanism that affords the above described desirable features.

It is a particular object of the invention to provide apparatus suited for remote actuation of channel selector means such as is used in electronic receiving equipment.

Another objective is the provision of manually operable, fluid actuated, mechanical means for operating rotatable apparatus through predetermined sequential angular increments.

It is also an object of the invention to provide positioning mechanism for rotary devices, affording, selectively, either remote or closely coupled manual operation thereof.

A specific object of the invention is to provide television receiver channel selector mechanism adapted for remote control, and in which repeated fluid pressure impulses from a remote, manually operable pressure source will cause the mechanism to step through a number of channel positions until the desired predetermined position is reached.

It is a further particular object of the invention to provide remote means for energizing and deenergizing television receivers.

To these general ends, and in accordance with a preferred embodiment of the invention, a ratchet wheel is moved sequentially, and step-by-step, through predetermined angular increments by a pawl that is actuatable by air or fluid pressure, and in response to momentary pulsation of the actuating fluid, each angular increment corresponding to a different television channel. There is further provided means which is driven with the ratchet wheel and which is disposed and adapted to operate switch mechanism controlling the television receiver power circuit. In this way it is possible, for example, to deenergize the set when the ratchet wheel is stepped to a preselected position.

The apparatus and features of the invention may be clearly understood from the following detailed description taken with reference to the accompanying drawings, wherein.

Figure 1:
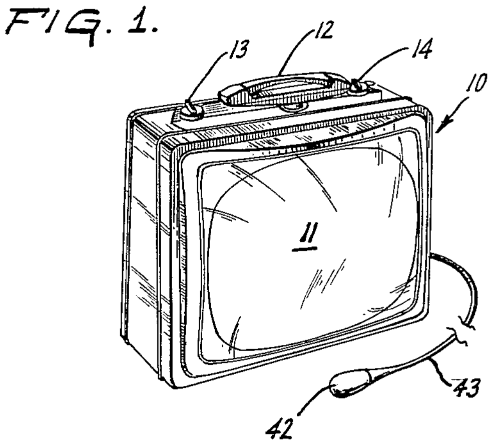
FIGURE 1 is a perspective showing of television receiving apparatus embodying the invention.
Figures 2, 4:
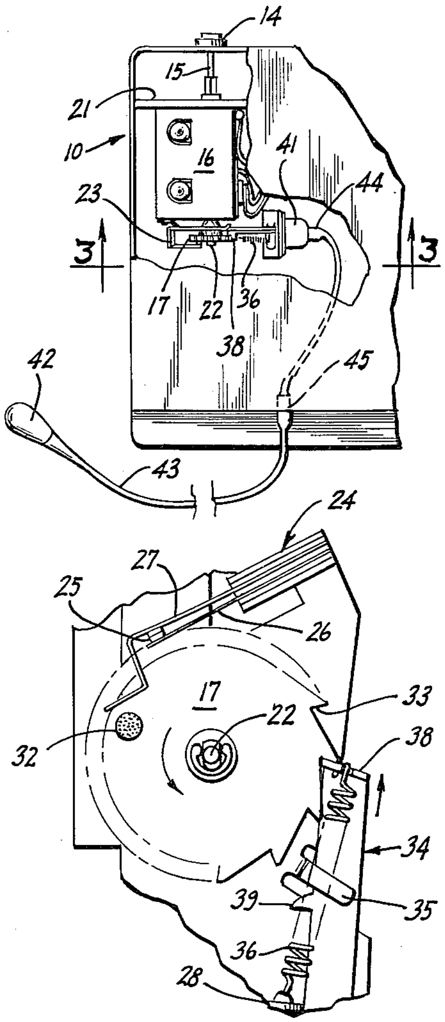
FIGURE 2 is a fragmentary elevational showing with parts broken away, looking toward the rear of the apparatus shown in FIGURE 1.
FIGURE 4 is a view similar to FIGURE 3, with parts broken away, and illustrating operation of the apparatus.

Now making particular reference to FIGURES 1 and 2 of the drawing, a portable television receiver is shown, this receiver including an outer cabinet 10, a viewing screen 11, a carrying handle 12 and control knobs 13 and 14 operably connected to suitable control means for television circuit means disposed within the cabinet. Reference will hereinafter be made only to the portion of the circuit means directly related to novel features of the present invention.

Control means with which the present invention is concerned, may and preferably does, comprise a rotatably mounted shaft 15, to which knob 14 is mounted, the shaft being arranged and disposed to drive the television tuner or channel selector designated generally by numeral 16 and mounted to chassis 21. For the purposes of this invention the channel selector may be of any one of a variety of known types. In apparatus widely marketed by applicant's assignee and illustrated in the accompanying drawings, it comprises a tuner of known wafer switch type in which pre-tuned circuit elements are carried by shaft 15, rotating therewith and cooperating with circuits within the receiver to effect channel selection as the shaft is stepped.

Figure 3:
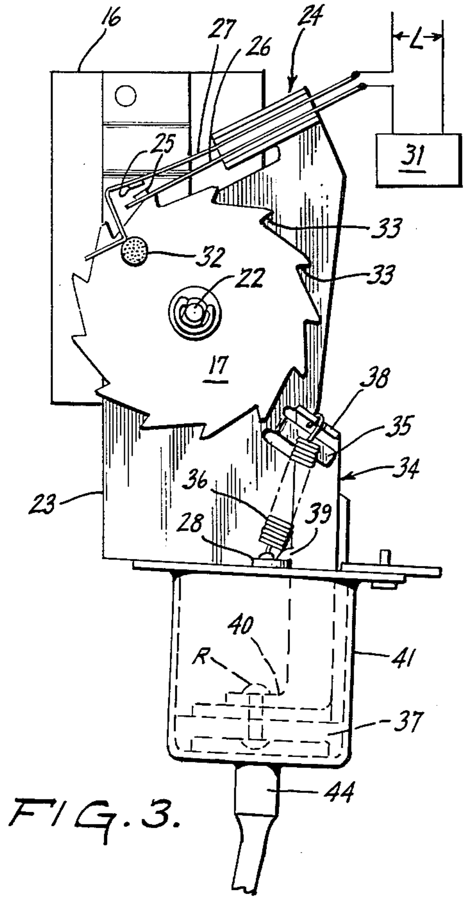
FIGURE 3 is an elevational showing of apparatus illustrated in FIGURE 2, and looking in the direction indicated by arrows 3—3 applied thereto.

Referring now to FIGURES 3 and 4, the ends of the aforesaid shaft 15 conveniently extend outwardly from the tuner, and a ratchet wheel 17 is affixed to the end 22 of the shaft opposite the manually operable knob 14. Bracket means 23 is conveniently affixed to tuner 16, and a switch 24 including contacts 25, carried by a stationary arm 26, and an actuating arm 27, is mounted upon the aforesaid bracket means 23.

As seen in FIGURE 3, switch 24 is disposed in series electrical circuit with an electrical source L and the operating circuitry of the television receiver, the latter being designated generally by the numeral 31. It will of course be understood that the switchable circuit elements of the selector 16 are also, selectively, brought into proper circuit relation with the receiver elements 31, by conductor means not shown herein.

The ratchet wheel 17 includes an abutment, or pin, 32 disposed for engagement with actuating arm 27 of switch 24 to provide for opening and closing the latter, thereby either to energize or deenergize the operating circuitry 31 of the television receiver. Ratchet wheel 17 is provided with a plurality of teeth 33, the number of teeth in the present embodiment being one more than the number of channels provided on television tuner 16. Pin 32 is located in a position to engage the actuating arm 27 of the switch when the tuner is rotated to the extra or "no-channel" position.

As best seen in FIGURE 3, the ratchet wheel is actuatable by extensible and retractable pawl means 34 mounted for slidable movements through tab 35 on bracket 23 and having a free bent end portion 38 disposed and arranged releasably to engage teeth 33 of the ratchet wheel. Each extension of pawl 34 will move the wheel through a predetermined angular increment, each increment corresponding to a different television channel. The pawl is resiliently urged toward its rest position, as provided for by a tab 39 extending laterally therefrom and abutting tab portion 28 of bracket 23, by a spring 36 reacting between said tab portion 28 and portion 38 of pawl 34. For reasons to be hereinafter more fully explained, spring 36 extends substantially diagonally across the main body portion of pawl 34, thereby urging the latter toward tab portion 28 of the bracket.

In particular accordance with the invention, operation of pawl 34 is provided for by mounting another bent portion 40 of the same, through the agency of a rivet R, upon a pneumatically operated, flexible and resilient piston 37 disposed and adapted for reciprocable movements within a cylinder 41 carried by bracket means 23. Mounting of pawl 34 upon piston 37 is such that the former is slightly offset from the center of the latter as well as from the center of cylinder 41. By virtue of the foregoing structural features, slight rocking movements of the pawl and piston assembly are accommodated, with diagonally extending spring 36 urging the pawl, in either its partially extended or in its rest position, rotatably about tab portion 28 of the bracket. Further rocking movements of the pawl, away from tab portion 28, are accommodated by the clearance between the latter and sides of the cylinder.

The above described rocking motion of the pawl advantageously provides for arcuate movements of free end 38 thereof both with the teeth 33 when driving the wheel and over the teeth when pawl 34 is moving to its rest position.

The source of air pressure for operating piston 37 within cylinder 41 comprises a manually compressible bulb 42 of rubber-like material, attached by a suitable air tight conduit, such for example as a flexible hose 43, to a suitable connector 44 disposed in fluid flow communication with interior portions of the cylinder. As will be understood, the piston 37 and the bulb 42 together constitute an air motor drivingly coupled to the shaft 15.

In the operation of the mechanism, each squeeze of bulb 42 effects a single extension of pawl 34 (FIGURE 4) to provide an angular increment of movement of ratchet wheel 17, thereby to rotate shaft 15 and move the switch 16 from one channel position to the next successive channel position. A predetermined number of repeated, alternate compressions and releases of bulb 42 will actuate the stepper mechanism, and the tuner, to the desired channel position.

Assuming that the television receiver is deenergized, as shown in FIGURE 3 (note engagement of pin 32 with actuating arm 27 of switch 24) energization of the receiver may be effected merely by stepping tuner shaft 15 to such position as to effect disengagement of pin 32 from the switch actuating arm, as illustrated in FIGURE 4. The television receiver can be deenergized again, merely by pressing the bulb a sufficient number of times to move the pin 32 into engagement with the switch actuating arm 27, thereby moving the latter and opening the switch, as again seen in FIGURE 3.

Portability of an electronic receiver provided with apparatus of the present invention may be enhanced further by providing suitable disconnect means as seen at 45 in FIGURE 2, to enable removal of the bulb and the exterior portion of hose or conduit 43. Such disconnect means, as shown at 45, may conveniently be disposed in the outer rear wall of the cabinet.

From the foregoing description it will be appreciated that the invention provides not only a very inexpensive remote control mechanism for tuner means of electronic devices, but also that the mechanism of the invention is characterized by positive action, simplicity, and ease of operation.

While a preferred embodiment of the invention has been illustrated, it will be understood that such modifications are contemplated as fall within the scope of the appended claims.

I claim:

1. Drive means for a rotatable multiple-position switch, comprising: a ratchet wheel disposed and adapted to rotate said rotatable switch, each tooth of said wheel corresponding to a position of said switch; a pawl movable between an extended and a retracted position disposed and adapted operatively to engage a tooth of said ratchet wheel in one direction of its movement to rotate said wheel and sequentially to disengage said tooth and engage another tooth in the other direction of its movement, the movement of said pawl between said extended and retracted positions being both translational and angular; and a fluid pressure actuated piston device including a cylinder and a flexible and resilient piston movable within said cylinder, said piston mounting said pawl and disposed and adapted to move the latter, said flexible and resilient piston accommodating the mentioned angular movements of said pawl.

2. In ratchet and pawl apparatus, a ratchet wheel, a pawl disposed and adapted operatively to engage said wheel to rotate the same, said pawl being both translatably and angularly movable in a plane when rotating said wheel, and fluid actuated piston means including a cylinder and a flexible and resilient piston supporting said pawl, said piston being operative by fluid pressure changes to effect the mentioned translatable movements of the pawl while resiliently accommodating the mentioned angular movements of the latter.

References Cited in the file of this patent

UNITED STATES PATENTS

| | | |
|---|---|---|
| 1,877,502 | Flocco | Sept. 13, 1932 |
| 2,491,361 | Burdick | Dec. 13, 1949 |
| 2,874,625 | Thalhammer | Feb. 24, 1959 |
| 2,805,379 | Troeller | Sept. 3, 1957 |

FOREIGN PATENTS

| | | |
|---|---|---|
| 210,798 | Australia | Oct. 23, 1957 |